United States Patent [19]

Moore et al.

[11] 4,424,404

[45] Jan. 3, 1984

[54] ENCLOSURE FOR ELECTRICAL COMPONENTS

[75] Inventors: Brian E. Moore, Greenwood; Richard D. Buis, Indianapolis, both of Ind.

[73] Assignee: Endress & Hauser, Inc., Greenwood, Ind.

[21] Appl. No.: 308,453

[22] Filed: Oct. 5, 1981

[51] Int. Cl.³ .............................................. H05K 5/04
[52] U.S. Cl. .................................... 174/52 R; 361/399
[58] Field of Search ...................... 174/52 R, 52 S, 59, 174/60, 50; 361/394, 399

[56] References Cited

U.S. PATENT DOCUMENTS

| 826,097 | 7/1906 | Frantzen et al. | 174/52 R X |
|---|---|---|---|
| 2,222,438 | 11/1940 | Manson | 174/65 R |
| 2,932,819 | 4/1960 | Steel | 174/52 R X |
| 3,036,207 | 5/1962 | Endelson | 220/3.8 X |
| 3,573,343 | 4/1971 | DeSmidt et al. | 174/52 R |
| 3,989,333 | 11/1976 | Cauldwell | 174/52 R X |

Primary Examiner—A. T. Grimley
Assistant Examiner—D. A. Tone
Attorney, Agent, or Firm—Barnes & Thornburg

[57] ABSTRACT

An enclosure for electrical components and the like is disclosed which protects the components in hazardous environments. The enclosure includes a unitary body having a generally cylindrical cavity and a closure securable to the body for closing the top of the cavity. A land within the cavity supports a first electrical component substantially normal to the axis of the cavity. Two pairs of longitudinal slots are provided for receiving second and third electrical components normal to the first component. A first internally and externally threaded outlet is situated at the bottom of the body substantially axially aligned with the cavity and second and third internally threaded outlets are located on opposite sides of the body generally above the land supporting the first component.

8 Claims, 4 Drawing Figures

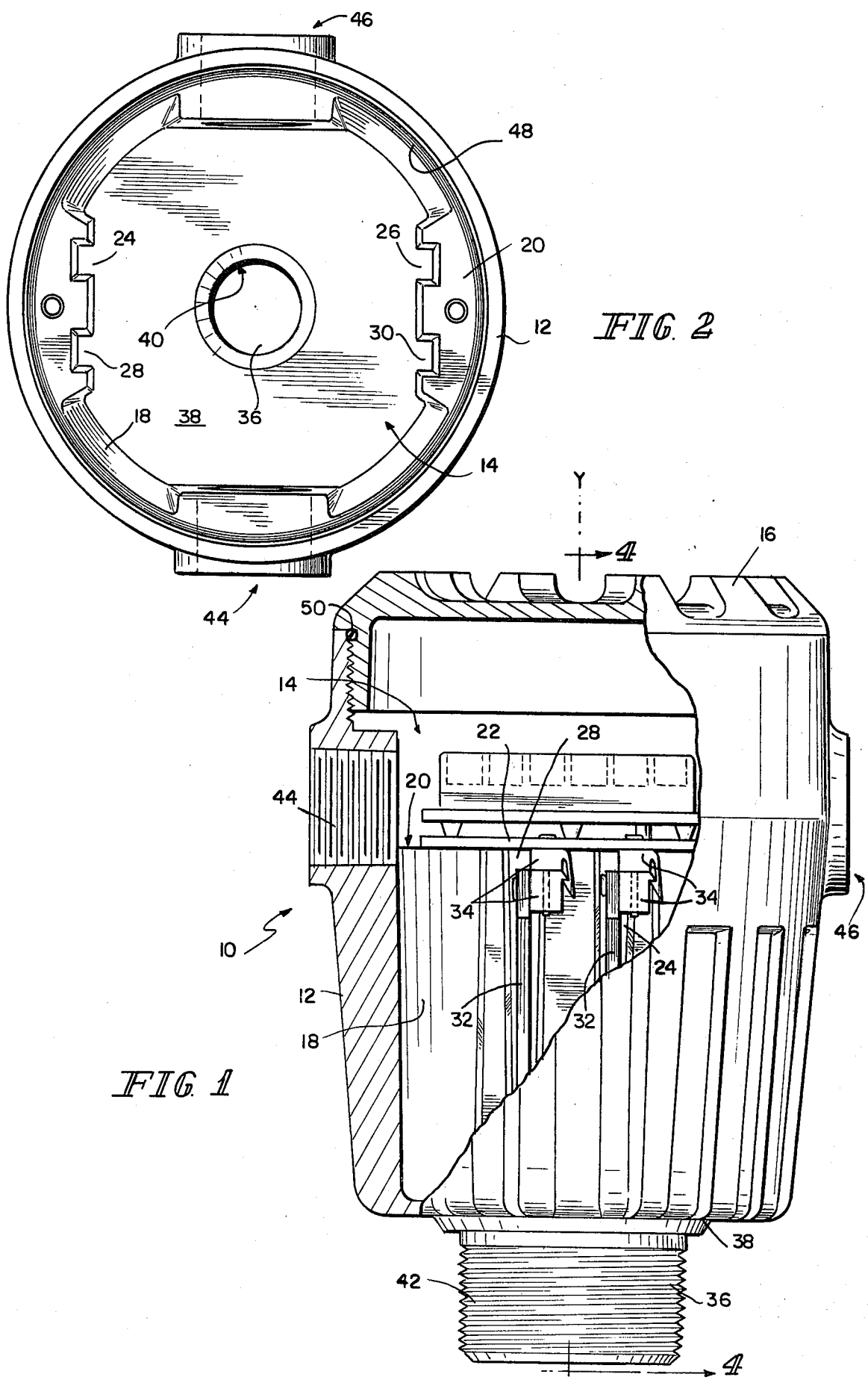

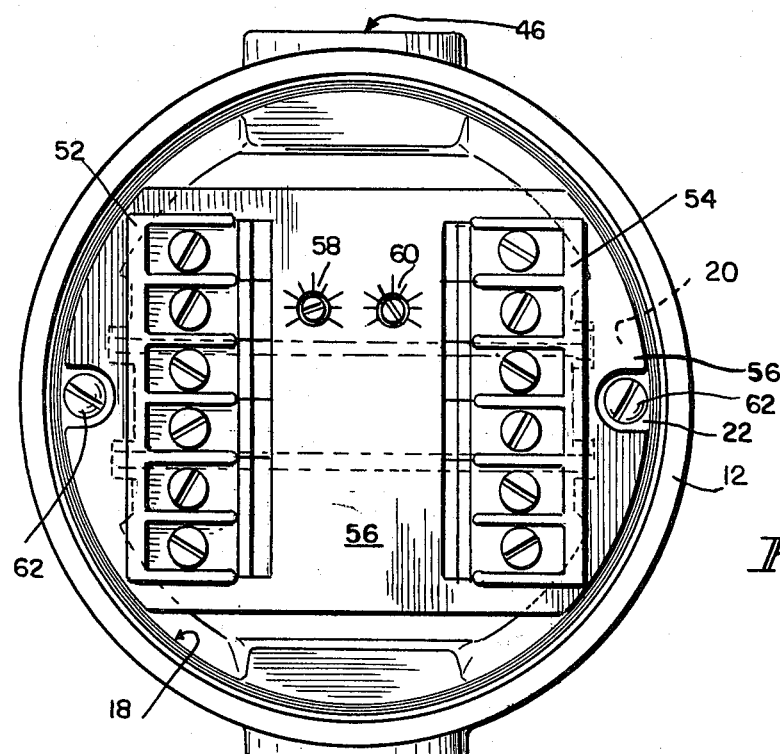
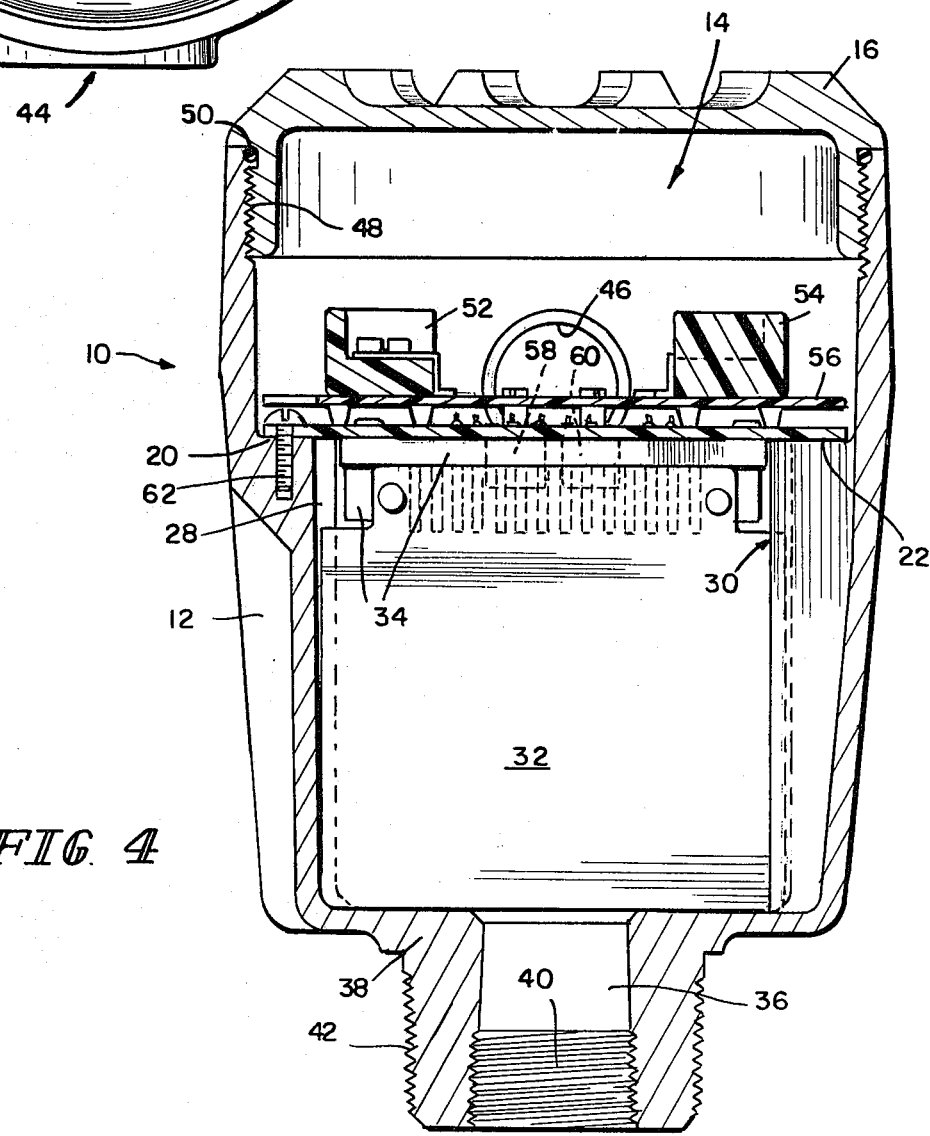
FIG. 3
FIG. 4

ENCLOSURE FOR ELECTRICAL COMPONENTS

The present invention relates generally to housings for electrical and electronic components, and more particularly to enclosures designed for use in hazardous locations, particularly to contain process instrumentational electronics or the like.

Commercially available enclosures designed for enclosing electrical components in hazardous environments typically consist of a generally sealed container body having a cylindrical cavity, a single internally threaded opening provided at the bottom of the cavity, and a single threaded conduit opening at the side of the body. The side opening into the body is generally to a central portion of the body, there being no design considerations being given to the process electronics which may be contained by the housing. As a result, the single threaded conduit opening at the side of the enclosure is often inappropriately placed with respect to the electronics sought to be contained within the housing, thus requiring that interconnecting wiring entering through the side conduit be fished up past the electronics for connection at the top of an electronic module contained within the enclosure.

It is therefore an object of the present invention to construct an enclosure for electrical components for protecting the same in hazardous environments which is especially adapted for secure location and containment of the electronics and for ease of electrical connection. It is a further object of the present invention to design an enclosure for process electronics which permits the adjustment of the electronic package or module without the necessity of removing the same from the enclosure.

These objects are fulfilled by an enclosure comprising a body having a generally cylindrical cavity therein with a closure securable to the body for closing the top of the cavity. A land is provided within the cavity for supporting a first component substantially normal to the axis of the cavity. At least one pair of longitudinal slots are arranged substantially parallel to the axis of the cavity for receiving a second component normal to the first component in such a manner as will permit interconnection between the first and second components. A first internal and externally threaded outlet is situated at the bottom of the body substantially axially aligned with the cavity. Second and third internally threaded outlets are located on opposite sides of the body generally above the land supporting the first component so as to permit easy top connection between wires passing through the second and third outlets and the first component.

The presence of the second and third internally threaded outlets located at opposite sides of the body allows for increased ease of alignment of the openings with conduits or the like by the installing technician. The presence of the second external thread situated at the bottom of the body permits any number of advantageous support situations, including the self-supporting of the housing in connection with sensors or the like. The arrangement of the longitudinal slots for receiving electronic components such as printed circuit boards in a vertical orientation permits increased utilization of the space available within the housing and permits ease of assembly yet secure alignment of the various components in the event of shock or vibration. The presence of the land within the cavity supporting the first component printed circuit board substantially normal to the axis of the cavity assures overall alignment of the various component printed circuit boards. The arrangement of the land below the outlets located on opposite sides of the body permits a top connection for all electronics without requiring unsophisticated customers or users to disturb any of the electronics packaged on the component boards.

Other features and advantages of the present invention will become apparent to those of ordinary skill in the art upon consideration of the accompanying figures which illustrate the preferred embodiment of the present invention.

FIG. 1 is an elevation view partially in section of a housing according to the present invention;

FIG. 2 is a plan view of the housing illustrated in FIG. 1 with the cover removed;

FIG. 3 is an elevation view identical to that of FIG. 2, but with exemplary process electronics installed; and FIG. 4 is a sectional view of the housing shown in FIG. 1, taken along line 4—4.

An enclosure 10 according to the present invention includes a body 12 having a generally cylindrical cavity 14 and a closure 16 securable to the body 12 for closing the top of cavity 14. The inside wall 18 defining the generally cylindrical cavity 14 includes a land 20 for supporting a first component board 22 substantially normal to the axis Y of the cavity. Below the land 20, the inside wall 18 further includes slots 24 and 26 defining a first pair of longitudinal slots and slots 28 and 30 defining a second pair of longitudinal slots which are arranged substantially parallel to the axis Y of the cavity 14 for receiving additional component boards normal to the first component board 22. A second component board 32 is shown installed in the second pair of slots 28, 30 substantially perpendicular to the first component board 22 and interconnected by an appropriate printed circuit board header connector 34 mounted on the bottom of component board 22. The slots 28, 30 act as supports for the second component board 32 to support the board in an upright relationship.

A first outlet 36 is situated at the bottom 38 of the body 12 generally axially aligned with the cavity 14. The first outlet includes internal threads 40 preferably ¾ inch NPT size for receiving a standard electrical conduit. The first outlet 36 also includes external threads 42 which are preferably 1½ inch NPT for mating the enclosure 10 with appropriate instrumentation, sensors, or the like.

Second and third outlets 44 and 46 are provided on opposite sides of body 12 generally above land 20. The second and third outlets 44 and 46 preferably include ¾ inch NPT threads adapted to receive standard electrical conduit.

At the top of the unitary body 12, there is provided an internal thread 48 for receiving the threads of closure 16. A sealing means such as O-ring 50 is preferably included between the closure 16 and body 12 so as to effect a hermetic seal. In the illustrated preferred embodiment, the removal of the cap reveals a pair of terminal blocks 52 and 54 supported above the first component board 22 on protective cover 56. Controls such as potentiometers 58, 60, and the like can protrude through protective cover sheet 56 to permit adjustment of the electronics package without removal of the electronics from the enclosure 10. The terminal blocks 52 and 54 are situated with respect to openings 44 and 46 such that connections with wires entering the housing through either opening 44, 46 may be easily accomplished without disturbing the underlying electronics. The relationship is best illustrated by FIG. 4 where terminal blocks 52 and 54 are shown to be generally on the same horizontal plane as opening 46.

In use, it is generally anticipated that wires from a sensor or the like attached to bottom 38 of enclosure 10 would enter through opening 36 and be connected directly to one or more longitudinally arranged circuit boards 32. After this connection had been accomplished and the circuit boards 32 were in place in the slots 24, 26, 28, 30, the component board 22 and protective cover sheet 56, together with terminal blocks 52 and 54, would be placed over component boards 32 and the edge connectors 34 between boards 22 and 32 engaged. The component board 22 would then be secured to the housing 10 by screw fasteners 62. This electronics package within housing 10 would then be ready for installation in a desired location.

At an appropriate location, wires extending through conduits mechanically connected to openings 44 and 46 would be attached to terminal blocks 52 and 54. The closure 16 would then be fastened to the top of body 12 in such a manner as to hermetically seal the contents of the enclosure 10 with respect to the surrounding environment. While an enclosure of the present invention might be made of any material capable of hermetically sealing the contents and cooperating with standard threaded electrical conduit, the preferred embodiment as shown is cast aluminum. Although the invention has been described and illustrated only in a single embodiment, it will be appreciated that certain modifications can be made without departing from the spirit of the invention as expressed in the appended claims.

What is claimed is:

1. An enclosure for enclosing electrical components and the like, and protecting the same in hazardous environments comprising:
a body having a generally cylindrical cavity therein;
a closure securable to the body for closing the top of the cavity;
a land within the cavity for supporting a first component substantially normal to the axis of the cavity;
at least one pair of longitudinal slots arranged substantially parallel to the axis of the cavity for receiving a second component normal to the first component;
a first internally threaded outlet situated at the bottom of the body substantially axially aligned with the cavity; and
second and third internally threaded outlets located on opposite sides of the body generally above said land.

2. The enclosure of claim 1 wherein said body is unitary.

3. The enclosure of claim 1 wherein said closure further includes sealing means for environmentally sealing the cavity of the enclosure.

4. The enclosure of claim 1 further comprising an external thread on said first outlet.

5. The enclosure of claim 1 wherein there are two pairs of longitudinal slots.

6. An enclosure for enclosing electrical components and protecting the same in hazardous environments comprising:
a unitary body having a generally cylindrical cavity therein;
a closure securable to the body for closing the top of the cavity;
a land within the cavity for supporting a first component substantially normal to the axis of the cavity;
at least one pair of longitudinal slots arranged substantially parallel to the axis of the cavity for receiving a second component normal to the first component;
a first outlet situated at the bottom of the cavity substantially axially aligned with the cavity, and
second and third outlets located on opposite sides of the body generally above said land.

7. The enclosure of claim 6 wherein said first outlet further includes a first set of threads internal of said outlet and a second set of threads external of said outlet, said two sets of threads being coaxially arranged with respect to each other.

8. The enclosure of claim 6 further comprising sealing means for environmentally sealing said closure to said unitary body.

* * * * *